United States Patent [19]
Rose

[11] Patent Number: 4,517,220
[45] Date of Patent: May 14, 1985

[54] DEPOSITION AND DIFFUSION SOURCE CONTROL MEANS AND METHOD

[75] Inventor: John W. Rose, Scottsdale, Ariz.

[73] Assignee: Motorola, Inc., Schaumburg, Ill.

[21] Appl. No.: 523,214

[22] Filed: Aug. 15, 1983

[51] Int. Cl.³ .................... B05D 5/12; C23C 11/00; C23C 13/00; H01L 21/306

[52] U.S. Cl. .................... 427/8; 73/861.02; 118/712; 118/715; 156/614; 156/627; 427/86; 427/93; 427/248.1

[58] Field of Search .............. 156/614, 622, 626, 627, 156/657, 662, 345; 427/8, 93, 9, 10, 86, 248.1; 73/861.01, 861.02, 861.03; 118/712, 715

[56] References Cited

U.S. PATENT DOCUMENTS

| | | | |
|---|---|---|---|
| 2,867,546 | 1/1959 | MacNevir | 117/107 |
| 3,212,922 | 10/1965 | Sintl | 117/106 |
| 3,321,278 | 5/1967 | Theuerer | 23/204 |
| 3,348,984 | 10/1967 | Pammer | 148/174 |
| 3,409,483 | 11/1968 | Watson | 148/175 |
| 3,484,314 | 12/1969 | Bohne et al. | 148/188 |
| 3,511,702 | 5/1970 | Jackson et al. | 148/174 X |
| 3,556,875 | 1/1971 | Holloway et al. | 148/175 |
| 3,589,953 | 6/1971 | Thaxler | 148/189 |
| 3,755,016 | 8/1973 | Russ et al. | 148/189 |
| 3,769,104 | 10/1973 | Ono et al. | 148/175 |
| 3,902,860 | 9/1975 | Akai et al. | 156/609 |
| 4,190,470 | 2/1980 | Walline | 427/8 X |
| 4,287,224 | 9/1981 | Heimbach et al. | 427/255.3 X |
| 4,315,796 | 2/1982 | Nishizawa | 156/614 |
| 4,388,342 | 6/1983 | Suzuki et al. | 427/8 |
| 4,400,411 | 8/1983 | Yuan et al. | 427/86 |

OTHER PUBLICATIONS

Yaws, Carl L. et al., *Physical and Thermodynamic Properties of Silicon Tetrachloride*, Solid State Technology, Feb. 1979, pp. 65-70.

*Primary Examiner*—Michael R. Lusignan
*Attorney, Agent, or Firm*—Robert M. Handy

[57] ABSTRACT

The uniformity and reproducibility of doped, deposited, or etched layers formed in a reaction chamber by a reactant derived in part from a solid or liquid reactant source, through which a carrier gas flows, is improved by dynamically adjusting the carrier gas flow so that the ratio of the partial pressure of the reactant and the partial pressure of the carrier gas in the source chamber remains substantially constant. This is conveniently accomplished by measuring the instantaneous source temperature therefrom, and then dynamically adjusting the carrier gas flow into the system to keep the total pressure of the reactant vapor plus carrier gas mixture in the source chamber at a predetermined value.

8 Claims, 5 Drawing Figures

DEPOSITION AND DIFFUSION SOURCE CONTROL MEANS AND METHOD

BACKGROUND OF THE INVENTION

1. Field of the Invention

This invention relates in general to means and methods for controlling the amount of a volatile reactant derived from a solid or liquid source and sent to a reaction vessel, and more particularly, to improved means and methods for supplying such a reactant in a highly uniform and reproducible manner in connection with the manufacture of electronic devices.

2. Background Art

Solid and liquid reactant sources are widely used in the manufacture of electronic devices, particularly semiconductor devices. They are used in connection with formation and/or doping of many types of layers or regions, as for example; amorphous, polycrystalline, or epitaxial semiconductor layers; dielectric layers of many compounds; metal and semimetal conductor layers; and doped semiconductor regions. The reactant derived from the solid or liquid source may form the entire layer, or become one constituent of a compound layer, or be provided as a dopant to a pre-existing layer or region, or a combination thereof. A typical example of the use of liquid sources, is the use of silicon bearing compounds, such as tri-chlorosilane and/or silicon tetra-chloride which are liquid at ordinary temperatures, as sources of silicon for the growth of silicon layers on semiconductor wafers. A typical example of the use of a solid source, is the use of various solid boron compounds, such as boron glasses or ceramics, as a source of boron for doping of semiconductor wafers or layers.

A common problem in reactions systems using liquids or solids as a source for a reactant, is achieving a high degree of uniformity and reproducibility of the reaction rate. For example, in silicon epitaxial reactors wherein the silicon is derived from tri-chorosilane or silicon tetra-chloride, it has not been possible to achieve a high degree of run-to-run reproducibility of layer growth rate and/or terminal thickness. This is due to the fact that there are many variables in the system, as for example, source temperature, gas flow rate, reactor pressure, and the like, which have an effect on the amount of the reactant which is transported from the source material into the reaction chamber where epitaxial deposition occurs. While one could, ideally, obtain more uniform layer growth and repeatability by precisely regulating these and other variables, in practice this has not been practical, particularly with high throughput, volume production, systems. It is highly desirable to be able to more closely regulate and reproduce layers, films, doped regions, etched regions, and the like, which depend on the use of liquid or solid sources of reactants. Thus, a need continues to exist for improved means and methods for deriving one or more reactants from liquid and/or solid sources and transporting them to a reaction chamber in a very uniform and reproducible manner.

Accordingly, it is an object of the present invention to provide an improved method for deriving reactants from liquid or solid sources and transporting them to a reaction chamber, particularly in arrangements employing a carrier gas.

It is a further object of the present invention to provide an improved means and method for controlling the flow of a reactant derived from a liquid or solid source into a reaction vessel in a highly uniform and reproducible manner.

It is a still further object of the present invention to provide an improved means and method for uniformly and reproducibly forming layers on semiconductor devices.

It is an additional object of the present invention to provide an improved means and method for uniformly and reproducibly doping and/or etching semiconductors.

It is a yet additional object of the present invention to achieve the above noted objectives in systems suited to high throughput volume manufacturing.

SUMMARY OF THE INVENTION

In accordance with the present invention there is provided a source chamber coupled to a reaction chamber. The source chamber is adapted to contain a liquid or solid source of a volatile reactant material. The reaction chamber is adapted to contain the substrate, object, or material on which the reactant is to be deposited or in connection with which the reaction is to take place. A carrier gas means is provided to furnish a carrier gas to transport the volatile reactant material from the source chamber into the reaction chamber. Means is further provided for determining the temperature and/or partial pressure of the volatile reactant in the source chamber. Control means is provided for varying the pressure of the carrier gas in the source chamber so as to maintain a substantially constant ratio of the partial pressure of the reactant vapor to the carrier gas. In a preferred embodiment, the partial pressure of the volatile reactant is determined by measuring the temperature of the source material and using predetermined vapor pressure-source temperature data for the volatile reactant.

There is further provided an improved method for introducing into a reaction chamber, a volatile reactant derived from a solid or liquid source material held in a source chamber, by passing a carrier gas through the source chamber to transport the volatile reactant into the reaction chamber, and adjusting the pressure of the carrier gas in the source chamber to have a substantially constant relation to the vapor pressure of the volatile reactant in the source chamber. In a preferred embodiment, the pressure adjusting step is carried out by measuring the temperature of the source material, determining the vapor pressure of the volatile reactant from the source temperature or a quantity proportional thereto, and adjusting the flow of the carrier gas to maintain a pre-set ratio of the partial pressure of the volatile reactant and the partial pressure of the carrier gas in the gas mixture being transferred to the reaction chamber. This pre-set ratio is conveniently held constant by adjusting the total pressure of the reactant vapor-carrier gas mixture in the source chamber to have a value derived from the pre-set ratio, and the temperature and/or vapor pressure of the source material.

DETAILED DESCRIPTION OF THE DRAWINGS

Figure 1:
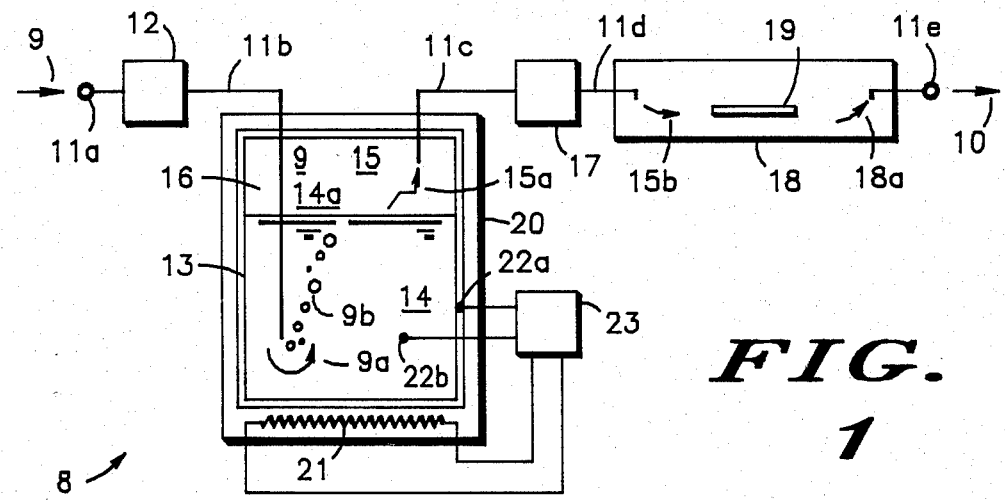
FIG. 1 shows a schematic diagram of a means for transferring a volatile reactant from a liquid source into a reaction chamber, according to the prior art.

FIG. 1 shows in schematic form, prior art system 8 for transferring volatile reactant 14a derived from liquid source 14 into reaction chamber or vessel 18. Carrier gas 9 is introduced into system 8 through gas inlet means 11a and carrier gas control valve 12. Carrier gas 9 then passes through inlet 11b into source chamber 13 containing liquid source 14 of the desired reactant. Typical examples of liquid reactant sources are boron halides as a source of boron, and silicon halides or silicon halo-silanes as a source of silicon. Others exist for different elements and compounds. Liquid reactant sources are well known in the art. Useful solid sources also exist and are well known in the art.

Carrier gas 9 bubbles through liquid source 14 in source chamber 13, as indicated by arrow 9a and bubbles 9b. The bubbling action serves, among other things to bring the carrier gas to substantially the same temperature as the liquid source and to insure that the carrier gas is saturated with reactant vapors derived from the liquid source. In space 16 above source 14, there exists gas mixture 15 comprising carrier gas 9 and volatile reactant vapor or gas 14a derived from liquid source 14. As used herein, the words vapor and gas are intended to be synonymous. Volatile reactant vapor 14a may be of the same proportional composition as liquid source 14 or of a different composition depending on whether fractionization or a reaction with the carrier gas occurs during vaporization. As used herein, the words volatile reactant, or reactant vapor or gas, are intended to refer to the vaporized components of the source which are substantially in equilibrium with the source, at the temperature and pressure of interest. It will be recognized by those of skill in the art, that a carrier gas and a reactant vapor may react to produce additional compounds, and as used herein in connection with the gas mixture formed from a carrier gas and a reactant vapor, the words gas mixture are intended to include such reaction products. Such reaction products, if formed, may also act as further reactants intended to be transported into the reaction vessel or chamber downstream from the source chamber.

Gas mixture 15 formed from carrier gas 9 and reactant vapor 14a in space 16 of source container or chamber 13, flows, as indicated by arrows 15a-b, into line 11c, through mass flow meter or controller 17, and into reaction chamber or vessel 18. In this manner volatile reactant 14a is transferred from source 14 to reaction chamber 18 where, as a result of further reactions occurring therein, reactant 14a, or some portion or compound thereof is deposited on or reacted with substrate 19. As indicated by arrow 18a, spent gases 10 exit reaction chamber or vessel 18 through exhaust outlet 11e.

In order to stabilize operation of liquid source 14, source chamber 13 is frequently enclosed in constant temperature enclosure 20. Enclosure 20 frequently will include heater 21 in connection with temperature sensor 22a in contact with chamber 13, or temperature sensor 22b immersed in liquid source 14, and controller 23 to regulate and stabilize the temperature of source chamber 13 and liquid source 14.

Figure 2A:
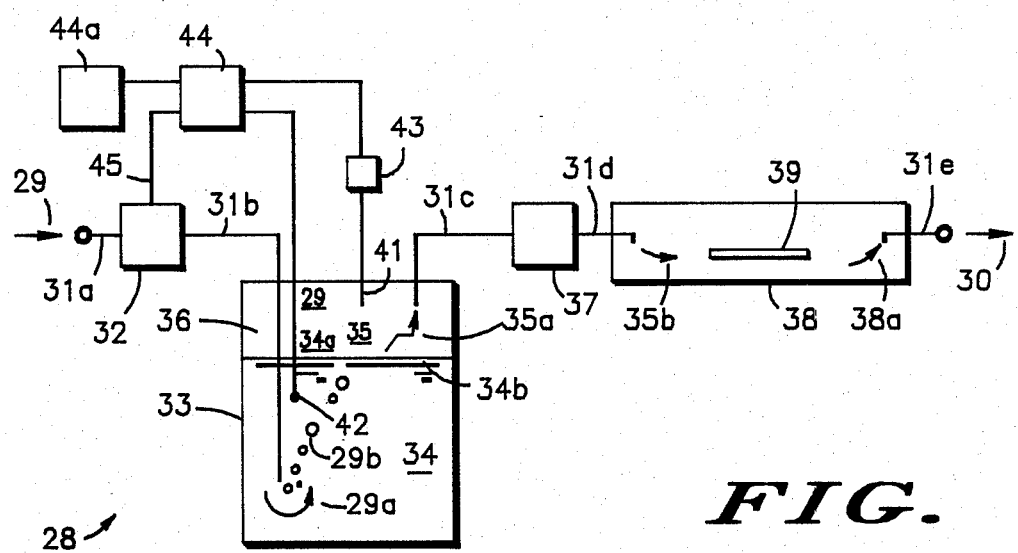
FIG. 2A shows a schematic diagram of a means for controlling the introduction of a volatile reactant from a liquid source into a reaction chamber, according to the present invention.
Figure 2B:
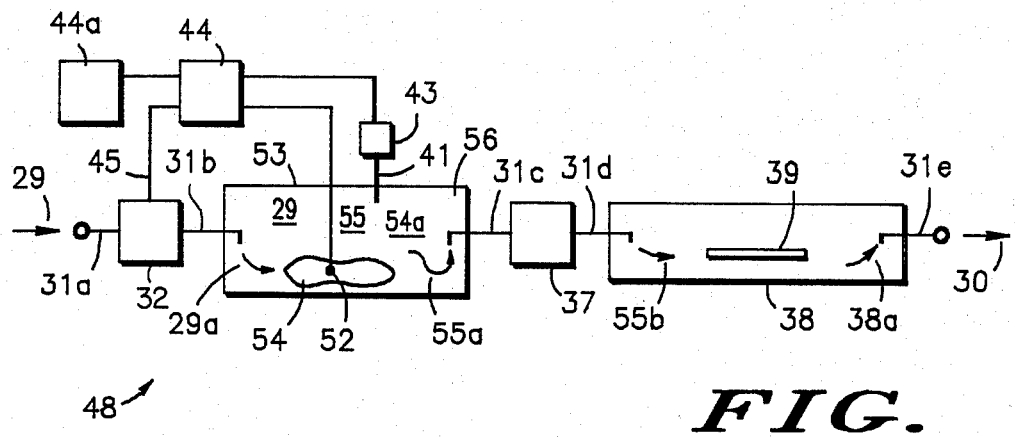
FIG. 2B shows a schematic diagram of a means for controlling the introduction of a volatile reactant from a solid source into a reaction chamber, according to the present invention.
Figure 3:
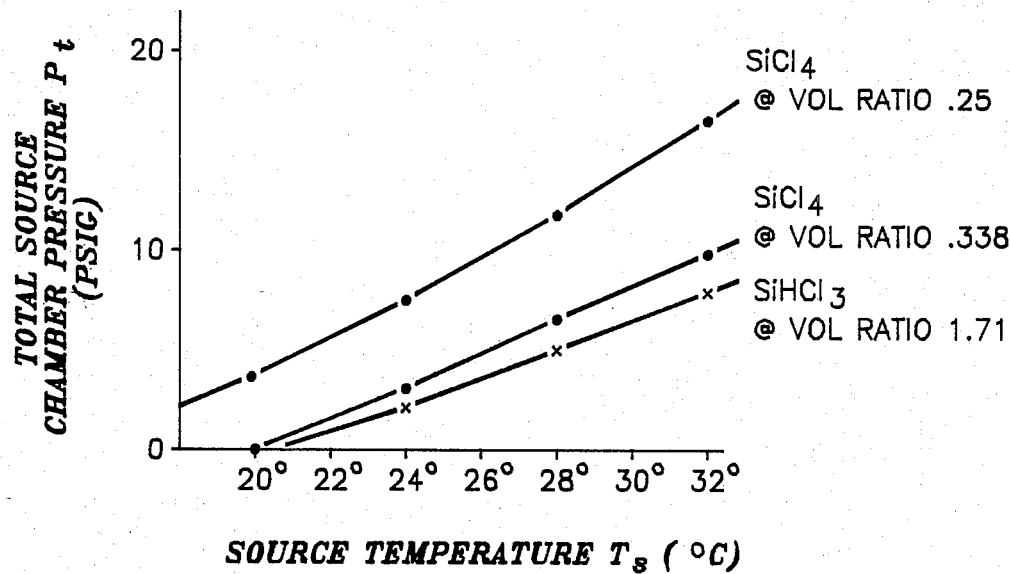
FIG. 3 shows a plot of the relationship between total pressure in the source chamber and source temperature, for two different liquid sources of silicon, and at different predetermined values of reactant partial pressure to carrier gas partial pressure.
Figure 4:
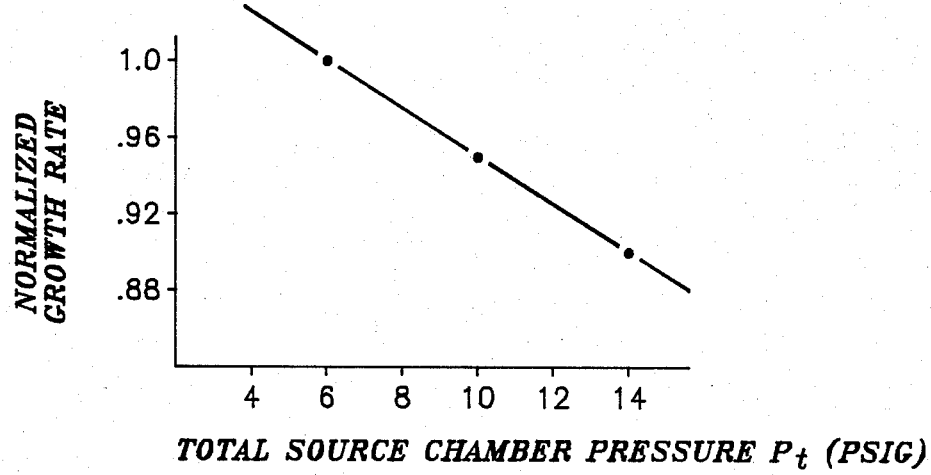
FIG. 4 shows a plot of epitaxial layer growth rate versus total source chamber pressure.

FIG. 2A shows, in schematic form, improved system 28 according to the present invention, for transferring volatile reactant 34a from liquid source 34 into reaction chamber or vessel 38. FIG. 2B shows, in schematic form, improved system 48 according to a further embodiment of the present invention, for transferring volatile reactant 54a from solid source 54 into reaction chamber or vessel 38. Systems 28 and 48 have many elements in common, as indicated by the use of the same identifying numbers in both figures. The same numbers are used to identify elements which are the same in FIGS. 2A and 2B and which function in the same way.

Carrier gas 29 is introduced into systems 28 and 48 by means of inlet 31a and regulator valve 32, from whence it flows via line 31b into source chamber 33 or 53, according to the particular embodiment. Source chamber 33 in FIG. 2A contains liquid source 34. Carrier gas 29, as indicated by arrow 29a and bubbles 29b, is bubbled through liquid source 34 in much the same way as in prior art system 8 and for the same reasons. In space 36 above liquid source 34, gas mixture 35 is formed from volatile reactant vapor 34a and carrier gas 29 (and any reaction products thereof). Volatile reactant 34a, in vapor form, derives from and is substantially in equilibrium with liquid source 34. Volatile reactant 34a may be of the same or different composition as liquid source 34, for the same reasons discussed in connection with source 14 and reactant vapor 14a of prior art system 8.

It is well known that when an empty container is partially filled with a liquid or solid, the remaining space in the container will be occupied by a vapor which is a gaseous form of the liquid or solid. The pressure exerted by this gas in equilibrium with its own solid or liquid is called the vapor pressure $P_v$ of the material, and depends upon the composition of the material and its temperature, that is, $P_v = f(T_s)$ where $T_s$ is the source material temperature and $f(T_s)$ is a known function. The vapor pressures of many substances as a function of temperature are readily available in the technical literature, see for example, the *Handbook of Chemistry and Physics*, 61st Edition, 1980-81, published by the Chemical Rubber Publishing Company, Boca Raton, Fla. If not already available, then $f(T_s)$ can be readily measured by means well known in the art.

When there is a mixture of gases, as for example, gas mixture 35 in space 36, made up of carrier gas 29 and reactant vapor 34a (and/or any reaction products thereof), then according to Dalton's Law, the total pressure $P_t$ exerted by the mixture is the sum of the separate pressures which each gas would exert as if it alone occupied the whole volume. These separate pressures are called the partial pressures of the separate gases. When mixed with carrier gas 29 in chamber 33, the partial pressure $P_r$ of volatile reactant vapor 34a is its vapor pressure $P_v$ in equilibrium with its liquid source 34, that is, $P_r = P_v$. Similarly, the partial pressure $P_r$ of volatile reactant vapor 54a is its vapor pressure in equilibrium with its solid source 54. The total pressure $P_t$ in source chamber 33 or 53 which is exerted by mixture 35 or 55 of carrier gas 29 and reactant vapor 34a or 54a, ignoring any reaction products, is $P_t = P_c + P_r$, where $P_c$ is the partial pressure of the carrier gas in chamber 33. If reaction products are formed, then they would also contribute to $P_t$, and there would be a corresponding decrease in $P_c$ and $P_r$.

In FIG. 2A, gas mixture 35, comprising carrier gas 29 and reactant vapor 34a, is led (see arrows 35a–b) via line 31c through mass flow indicator and/or controller 37 and line 31d into reaction chamber or vessel 38, thereby transferring reactant 34a from source 34 to reaction chamber 38 where, as a result of further reactions occurring therein, volatile reactant 34a or some portion or compound thereof is deposited on or reacted with substrate 39. Substrate 39 is typically a semiconductor wafer or a support for a semiconductor wafer, but may be any suitable object. As indicated by arrow 38a, spent gases 30 exit reaction chamber 38 through exhaust outlet 31e.

Temperature sensing means 42, for example a thermocouple or thermistor, is immersed in liquid source 34 in source container or chamber 33 to determine the temperature $T_s$ of liquid source 34. Temperature sensing means 42 is desirably located near free surface 34b of liquid source 34 so as to measure as nearly as possible the temperature of free surface 34b of liquid source 34 in substantial equilibrium with reactant vapor 34a. Temperature sensing means 52 is immersed in or in contact with solid source 54 in source container 53 in an analogous manner. Temperature sensors 42 or 52 are coupled to control means 44.

Source container or chamber 33 or 53 is also provided with pressure probe 41 connected to pressure transducer and/or indicator 43, which in turn is coupled to control means 44. Pressure probe 41 and indicator-transducer 43 permit measurement of total pressure $P_t$ of gas mixture 35 or 55 in source chamber 33 or 53 respectively. Control means 44 has output 45 for controlling the setting of carrier gas regulator valve 32. Control means 44 desirably includes vapor pressure reference means 44a, wherein is stored or computed, for example, information on the vapor pressure of reactant 34a or 54a as a function of temperature $T_s$ of source 34 or 54, respectively.

The embodiments of FIGS. 2A and 2B differ only in that in FIG. 2A, source 34 for reactant 34a is a liquid, while in FIG. 2B, source 54 for reactant 54a is a solid. Source chambers or containers 33 and 53 are analogous, as are gas mixtures 35 and 55, respectively. Other than those differences which arise as a result of the source being a liquid or a solid, the operation of the embodiments shown in FIGS. 2A and 2B is analogous.

Prior art systems such as are depicted in FIG. 1, are much used to deposit epitaxial silicon. A silicon wafer is typically placed on substrate 19 in reaction chamber 18, and tri-chlorosilane or silicon tetra-chloride used as source liquid 14, with hydrogen as carrier gas 9. It has been found that growth rate uniformity and final thickness repeatability vary significantly from run to run. Despite careful regulation of the temperatures of source chamber 13 and reaction chamber 18, and keeping other system variables, such as gas flow, source liquid level, gas pressure, exhaust pressure, and the like, as constant as practical, a high degree of repeatablility could not be obtained in a production environment with prior art systems. While some runs repeat with smaller variations, others exhibit larger differences. The typical minimum epitaxial layer thickness variation, run-to-run, was found to be about 3%. It is highly desirable to be able to obtain run-to-run thickness repeatability in high volume production which is significantly better than 3%, and without requiring the use of thickness monitors within the reactor. It is important that the deposition rate uniformity with time be sufficiently constant and reproducible that run-to-run thicknesses can be repeated to better than 3% by simply operating the deposition reactor at a preset rate for a fixed period of time, without further in-process tailoring or manual re-adjustment. This has not proved to be possible with high volume production in prior art systems. While better repeatability might be obtained with small throughput research systems, such units are not useful for volume production.

It has been determined that the above noted deposition rate and thickness variations arise because of time dependant variations in the reactant-carrier gas concentration ratio during operation and from run-to-run. These concentration ratio variations are believed to occur because of the interaction of pressure fluctuations within the system and temperature fluctuations in the reactant source. These fluctuations occur despite the use of automatic pressure or flow regulators in the system gas lines and automatic temperature regulators for the source chamber. Large differences exist in the thermal and/or pressure transient response time of different parts of the system, hence oscillations, hunting, and/or imperfect control can arise even when gas flow rates and source temperature are supposedly automatically regulated.

In the prior art it has been customary to hold the temperature of the source material as constant as possible, typically by use of automatic temperature chambers or baths, e.g. container 20 in FIG. 1. The intent has been to stabilize reactant vaporization from the source by isolating it from other variables, as for example, room temperature fluctuations. This often creates additional difficulties, since maintaining source 14 at a temperature above room temperature can lead to reactant vapor condensation in the lines between source chamber 13 and reaction chamber 18 if any of these lines remain at or near room temperature, that is, below the temperature of source 14. In any case, as has been noted earlier, such methods are ineffective in obtaining run-to-run thickness repeatability for high throughput volume epitaxial layer growth of silicon on silicon, better than about 3%. What has not been previously appreciated is that transient temperature fluctuations within the source are inevitable in practical production systems which must handle large volumes of material, use large vessels, and have extended piping runs. Further it has not been previously appreciated that transient fluctuations cannot be prevented or adequately compensated by use of constantant temperature housings and/or temperature control systems for the reactant source.

The present invention avoids the above described problems by not attempting to hold the source temperature and/or reactant partial pressure at a fixed value. Rather, the reactant partial pressure is allowed to vary, whether in response to changes in source temperature or whatever, and the partial pressure of the carrier gas in the source chamber adjusted dynamically and at a high rate to maintain the reactant-carrier gas volume ratio $V_r/V_c$ or, equivalently, the pressure ratio $P_r/P_c$, in gas mixture 35 or 55 at a predetermined constant value. (Note that where both gases are at substantially the same temperature, as they are in mixture 35 or 55, then $V_r/V_c = P_r/P_c$.) If $V_r/V_c$ or $P_r/P_c$ is held constant, then gas mixture 35 or 55 fed from source chamber 33 or 53 to total mass flow regulator 37 always has the same composition. Mass flow regulator 37, acts to deliver a substantially constant mass flow per unit time of gas mixture 33 or 53 to reaction chamber 38. With this arrangement, both the proportion of reactant in gas mixture 33 or 53 and the amount of gas mixture 33 or 53 being delivered to reaction chamber 38 are held constant. Hence, the rate of arrival of reactant in reaction chamber 38 is substantially constant, and the growth rate of layers or other regions being formed by or from the reactant is therefore highly uniform. This leads to significantly improved repeatability. A significant advantage of the invented means and method is that the carrier gas volume and pressure may be varied quickly and easily, so that even rapid fluctuations in $P_r$ may be compensated to hold $P_r/P_c$ constant. This is in contrast to prior art systems using temperature stabilized source chambers, which because of their relatively large thermal mass and the thermal mass of source material therein, have a slow response time.

While techniques exist for directly measuring the relative concentrations of a reactant vapor and a carrier gas in a gas mixture, so that the carrier gas flow and/or pressure could be adjusted in response thereto to hold the ratio of reactant to carrier gas constant, it is convenient where the reactant is derived from a solid or liquid source to determine the reactant partial pressure $P_r = P_v$ from a measurement of the source temperature $T_s$ using the known relationship $f(T_s)$ between vapor pressure $P_v$ and source temperature $T_s$. An example of vapor pressure-temperature data for silicon tetra-chloride is given in Table I below.

The relationship $P_t = P_r + P_c$ between the total pressure $P_t$ of gas mixture 35 or 55, the partial pressure $P_r$ of reactant vapor 34a or 54a and the partial pressure $P_c$ of carrier gas 29, can be used to simplify the task of maintaining the ratio $V_r/V_c$ or $P_r/P_c$ constant. By substituting one obtains $P_r/P_c = P_r/(P_t - P_r) = f(T_s)/(P_t - f(T_s))$. Solving for $P_t$ one obtains, $P_t = (1 + P_c/P_r)f(T_s)$. Since $T_s$ is readily measured, and $f(T_s)$ is known or determinable for any given material, the value of $P_t$ necessary to maintain any predetermined value of the ratio $V_r/V_c$ or $P_r/P_c$ for different values of $T_s$, can be readily calculated. Table I gives an example of the values of $P_t$ necessary to maintain a ratio of $V_r/V_c = P_r/P_c = 0.25$, for different source temperatures, using the vapor pressure data $P_r = P_v = f(T_s)$ for silicon tetra-chloride over a $T_s$ range from sixteen to thirty-two degrees Celsius.

TABLE I

Total Gas Mixture Pressure $P_t$ Required to Maintain a Fixed Volume or Pressure Ratio $V_r/V_c = P_r/P_c = 0.25$, According to the Relation $P_t = (1 + P_c/P_r) f(T_s)$

| Source Temperature (C.) | $f(T_s)$ (mm Hg) | $P_t$ (mm Hg) |
| --- | --- | --- |
| 16 | 160 | 800 |
| 20 | 192 | 960 |
| 24 | 231 | 1155 |
| 28 | 275 | 1375 |
| 32 | 320 | 1600 |

In the preferred embodiments, control means 44 desirably functions as a feedback controller which uses temperature sensing means 42 or 52 in source 34 or 54, respectively, to measure $T_s$, and reference means 44a to provide $P_r = f(T_s)$, that is, the dynamic partial pressure $P_r$ of reactant vapor 34a or 54a in region 36 or 56 of source chamber 33 or 53, respectively. Control means 44 then dynamically determines the total pressure $P_t$ of gas mixture 35 or 55 in source chamber 33 or 53 required to maintain the ratio $V_r/V_c$ or $P_r/P_c$ at its predetermined value, by for example, evaluating the relationship $P_t = (1 + P_c/P_r)f(T_s)$. Control means 44 then adjusts carrier gas regulator valve 32, increasing or decreasing the flow of carrier gas 29 into source chamber 33 or 53, until gas mixture pressure $P_t$, measured by pressure probe 41 and pressure transducer-indicator 43, reaches the predetermined value. Changing the flow of carrier gas 29 into source chamber 33 or 53 causes $P_t$ to change since the rate at which gas mixture 35 or 55 is being removed from source chamber 33 or 53 is independently fixed by mass flow controller 37. Mass flow controller 37 regulates the mass flow of gas mixture 35 or 55 substantially unaffected by pressure variations in source chamber 33 or 53 produced by adjusting $P_t$ to hold $P_r/P_c$ constant. It is convenient but not essential to utilize a digitally operated value for carrier gas control regulator 32. The valve is modulated at a high rate. To increase the flow of carrier gas 29 and hence $P_t$, the pulse rate or width is increased, and contra to decrease the flow and $P_t$. Series B valves, manufactured by the Skinner Valve Company of New Britain, Conn., are suitable, but other types of valves, either analog or digital, may be used.

EXAMPLE (1)

The following is an example of the practice of the method of the present invention for the manufacture of epitaxial layers of silicon on silicon single crystal wafers. Those of skill in the art will recognize that the method is applicable in general to the formation, deposition, or etching of many types of layers on a variety of different materials, as for example, deposition of polycrystalline silicon or other materials, deposition or formation of oxides and nitrides, deposition or formation of intermetallic compounds, formation of doped regions in semiconductors, deposition or formation of layers on various substrates, and etching of a variety of surfaces and materials.

Reaction vessel 38 is provided in the form of a cylindrical or rectangular quartz envelope. Within reaction vessel 38 is provided a graphite susceptor which is heated by induction or radiation. The silicon wafers to be coated or reacted are placed on the susceptor. Connected to the apparatus is the gas and reactant supply means, substantially as illustrated by system 28 of FIG. 2, and discussed above. Silicon tetra-chloride is placed in source container 33. As is customary in the art, the system is purged to remove the air and to permit the silicon wafers to be heated to the desired operating temperature in an inert or reducing atmosphere prior to commencing the deposition reaction. Conventional auxiliary valves and gas supplies, not shown, are utilized for this purpose. These purging and preheating arrangements and steps are not a part of the present invention.

Hydrogen is used as carrier gas 29. The vapor pressure-temperature relationship of the source material is determined, either from published data or by measurement. For silicon tetra-chloride, the vapor pressure-temperature relationship is known. A volume (or pressure) ratio of source to carrier gas is chosen which, in connection with a predetermined mass flow rate of the source-gas plus carrier-gas mixture and the reaction temperature, will give the desired layer growth rate. Source-gas to carrier-gas pressure or volume ratios in the range 0.1 to 0.5 were found generally to be satisfactory for silicon tetra-chloride, although higher or lower values could be used. After the silicon wafers, or other substrate, have been brought to the desired deposition temperature, for example, in the range about 950 to 1300 Celsius for epitaxial growth of silicon on silicon, the hydrogen carrier gas is introduced into system 28 at inlet 31a. A hydrogen flow rate in the range of about 1 to 20 liters/min through the source was found to be satisfactory. The source temperature could vary typically within the range from about twenty to thirty-two degrees Celsius, although larger variations were possible. Temperature sensing means 42 is used to determine the temperature of source 34, reference means 44a is used to provide from this temperature a quantity proportional to the reactant vapor pressure over the source, and pressure probe 41 and sensor 43 are used to measure the total pressure of gas mixture 35 in source container 33. Control means 44 compares the actual value of total gas mixture pressure in source container 33 to the pressure necessary, for the measured temperature of the source, to maintain the gas mixture at the predetermined desired ratio of source to carrier gas. Control means 44 then automatically adjusts the flow of hydrogen into system 28 by varying valve 32 to maintain the total pressure of gas mixture 35 in source container 33 at the calculated value, so that the partial pressure ratio, and hence volume ratio, of the source-gas and the carrier-gas in gas mixture 35 entering reaction vessel 38 remains constant, independent of variations in the source temperature or other variables. Typical operating conditions and results are given in Table II below.

EXAMPLE (2)

In a second example, the same apparatus and general procedure were utilized, but with tri-chlorosilane as the silicon source. With tri-chlorosilane a convenient range of source-gas to carrier-gas volume or pressure ratio is 0.5 to 2.0, but higher or lower values can be used. Typical operating conditions and results are given in Table II below.

TABLE II

| Typical Operating Conditions for Deposition of Uniform Epitaxial Layers of Silicon on Silicon According to the Present Invention | | | | | |
|---|---|---|---|---|---|
| Source Mat. | Avg. Source Temp. (deg. C.) | $H_2$ Flow Rate (l/min) | Deposition Temp. (deg. C.) | Deposition Rate ($\mu$/min) | Run-to-Run Thickness Deviation |
| $SiCl_4$ | 25° | 15 | 1200° | 1.0 | <1% |
| $SiHCl_3$ | 25° | 15 | 1150° | 1.5 | <1% |

It will be apparent to those of skill in the art that the present invention provides an improved means and method for deriving reactants from liquid or solid sources and transporting them to a reaction chamber, particularly where a high degree of uniformity and repeatability of the reaction is desired. Further, it will be apparent that the improved means and method is particularly useful in the manufacture of semiconductors and semiconductor devices, and other electronic structures and devices which utilize solid and/or liquid reactant sources in their manufacture.

Having thus described the invention, it will be obvious to those of skill in the art that various modifications can be made within the spirit and scope of the present invention. In particular, many solid and liquid reaction sources can be used with a variety of reaction vessels and deposition or reaction substrates, and a variety of carrier gases. These carrier gases can be inert or reactive. Further, a variety of means of sensing the partial pressure of the reactant gas above the source may be used, and a variety of control means, so long as the ratio of source to carrier gas reaching the reaction vessel is held constant by dynamic adjustment of the carrier gas flow or pressure. Further the means and method of the present invention can be used for a wide variety of processes in which a liquid or solid is used as a reactant source, for example but not limited to, layer deposition, doping, etching, and surface catalized reactions. It is intended to encompass in the following claims, all such variations as fall within the spirit and scope of the invention.

I claim:

1. A process for controlling the formation of a layer derived at least in part from a source material having at least one constituent of said layer, comprising:
    providing a reaction vessel for forming said layer;
    providing in series with said reaction vessel a region for containing said source material;
    providing in series with said region containing said source material a variable flow means for a carrier gas, wherein said carrier gas is adapted to transport said source material, and wherein said variable flow means is adapted for varying the pressure of said carrier gas in said region;
    providing means for sensing the temperature of said source material;
    vaporizing a portion of said source material to provide within said region containing said source material a partial pressure of said source material for mixing with said carrier gas;
    flowing said carrier gas through said region containing said source material and into said reaction vessel; and
    in response to variations in temperature of said source material, adjusting said variable flow means of said carrier gas to maintain a total pressure within said region containing said source material so that said partial pressure of said source material remains a predetermined fraction of said total pressure.

2. A process for chemical deposition, comprising:
    providing a source material adapted to provide a vapor pressure of a reactant comprising at least one component of a material to be deposited;
    providing a reaction vessel containing a substrate to receive said material to be deposited;
    providing a source material chamber for containing said source material, wherein said chamber is coupled to said reaction vessel;
    passing through said chamber and into said reaction vessel, a flow of a carrier gas for transporting said reactant from said source material in said chamber into said reaction vessel, wherein said carrier gas has a partial pressure in said chamber; and
    in response to fluctuations of said vapor pressure of said reactant, adjusting said partial pressure of said carrier gas to remain at a substantially fixed multiple of said vapor pressure.

3. In a process using a flowing carrier gas to transport into a reaction vessel a volatile reactant material derived from a solid or liquid source material, the improvement comprising varying the flow rate of said carrier gas in response to fluctuations in the partial pressure of said reactant material to maintain a constant mass ratio of volatile reactant material to carrier gas.

4. In a process using a flowing carrier gas to transport into a reaction vessel a volatile reactant material derived from a solid or liquid source material, the improvement comprising varying the flow rate of said carrier gas in contact with said source material in response to fluctuations in the temperature of said source material, to maintain a constant ratio of partial pressure of said volatile reactant material to partial pressure of said carrier gas.

5. A process for chemical etching, comprising:
providing a source material adapted to provide a vapor pressure of an etchant;
providing a reaction vessel containing a substrate to be etched;
providing a source material chamber for containing said source material, wherein said chamber is coupled to said reaction vessel;
passing through said chamber and into said reaction vessel, a flow of a carrier gas for transporting said etchant from said source material in said chamber into said reaction vessel, wherein said carrier gas has a partial pressure in said chamber; and
in response to fluctuations of said vapor pressure of said etchant, adjusting said partial pressure of said carrier gas to remain at a substantially fixed multiple of said vapor pressure.

6. A system for maintaining a uniform flow of a volatile reactant, derived from a liquid or solid source material, into a reaction chamber, comprising:
a reaction chamber;
a source chamber coupled to said reaction chamber and adapted to contain said source material having said volatile reactant;
a carrier gas supply system for flowing a carrier gas through said source chamber and into said reaction chamber for transporting said volatile reactant from said source chamber to said react ion chamber;
means for determining the vapor pressure of said volatile reactant; and
means for varying the flow of said carrier gas through said source chamber so as to maintain the pressure of said carrier gas in said source chamber in fixed relation to said vapor pressure of said volatile reactant.

7. The system of claim 6 wherein said means for determining the vapor pressure of said volatile reactant comprises means for measuring the temperature of said source material, and means for determing the vapor pressure of said volatile reactant based upon the measured temperature of said source material.

8. The system of claim 7 wherein said means for varying the flow rate of said carrier gases includes means for measuring the total pressure of gases in said source chamber.

* * * * *